United States Patent [19]

Tarn et al.

[11] Patent Number: 5,670,009
[45] Date of Patent: Sep. 23, 1997

[54] ASSEMBLY TECHNIQUE FOR AN IMAGE SENSOR ARRAY

[75] Inventors: Terry Tarn, Pittsford; Thomas G. Bailey, Rochester, both of N.Y.

[73] Assignee: Eastman Kodak Company, Rochester, N.Y.

[21] Appl. No.: 395,750

[22] Filed: Feb. 28, 1995

[51] Int. Cl.$^6$ .................................................. H05K 13/04
[52] U.S. Cl. .................. 156/299; 156/285; 156/382; 156/539; 156/562; 269/21; 269/903; 29/740; 29/743; 29/834
[58] Field of Search ............................. 156/299, 297, 156/285, 423, 500, 539, 560, 562, 382; 269/21, 903; 29/743, 740, 834, 701; 228/44.7, 49.5, 212, 123.1

[56] References Cited

U.S. PATENT DOCUMENTS

| | | | |
|---|---|---|---|
| 3,831,250 | 8/1974 | Holiday | 29/701 |
| 3,859,723 | 1/1975 | Hamer et al. | 29/840 |
| 3,868,764 | 3/1975 | Hartleroad et al. | 29/701 X |
| 3,868,765 | 3/1975 | Hartleroad et al. | 29/701 X |
| 4,178,529 | 12/1979 | Kennedy | 313/544 |
| 4,292,116 | 9/1981 | Takahashi et al. | 29/743 X |
| 4,345,371 | 8/1982 | Ohsawa et al. | 29/836 |
| 4,386,464 | 6/1983 | Yanai et al. | 29/834 |
| 4,451,324 | 5/1984 | Ichikawa et al. | 156/562 |
| 4,473,842 | 9/1984 | Suzuki et al. | 29/832 X |
| 4,528,747 | 7/1985 | Hoffman et al. | 29/834 |
| 4,670,981 | 6/1987 | Kubota et al. | 29/840 |
| 4,854,039 | 8/1989 | Wendt | 29/832 |
| 4,868,979 | 9/1989 | Fukushima et al. | 29/840 |
| 4,914,809 | 4/1990 | Fukai et al. | 29/740 |
| 4,916,807 | 4/1990 | Wiese | 29/840 |
| 4,941,255 | 7/1990 | Bull | 29/833 |
| 4,965,927 | 10/1990 | Holzman | 29/740 |
| 4,979,289 | 12/1990 | Dunaway et al. | 29/834 |
| 5,034,802 | 7/1991 | Liebes, Jr. et al. | 257/672 |
| 5,074,036 | 12/1991 | Dunaway et al. | 29/834 |
| 5,086,557 | 2/1992 | Hyatt, Jr. | 29/832 |
| 5,153,985 | 10/1992 | Saraceni | 29/834 |
| 5,222,293 | 6/1993 | Ozimek et al. | 29/833 |
| 5,453,145 | 9/1995 | Beaman et al. | 156/299 X |

*Primary Examiner*—Michael W. Ball
*Assistant Examiner*—Francis J. Lorin
*Attorney, Agent, or Firm*—James D. Leimbach

[57] ABSTRACT

A package design and a method of assembling an array of CCD image devices on a substrate to provide an assembly with an optically flat surface. A tolerance of approximately between 2 and 3 microns is achieved by a process requiring less finishing of the substrates used by conventional processes. The assembly package can be used to bond an array of image sensors on a substrate having less than optimum flatness while still maintaining the optical surfaces of the image sensors within a single focal plane.

8 Claims, 3 Drawing Sheets

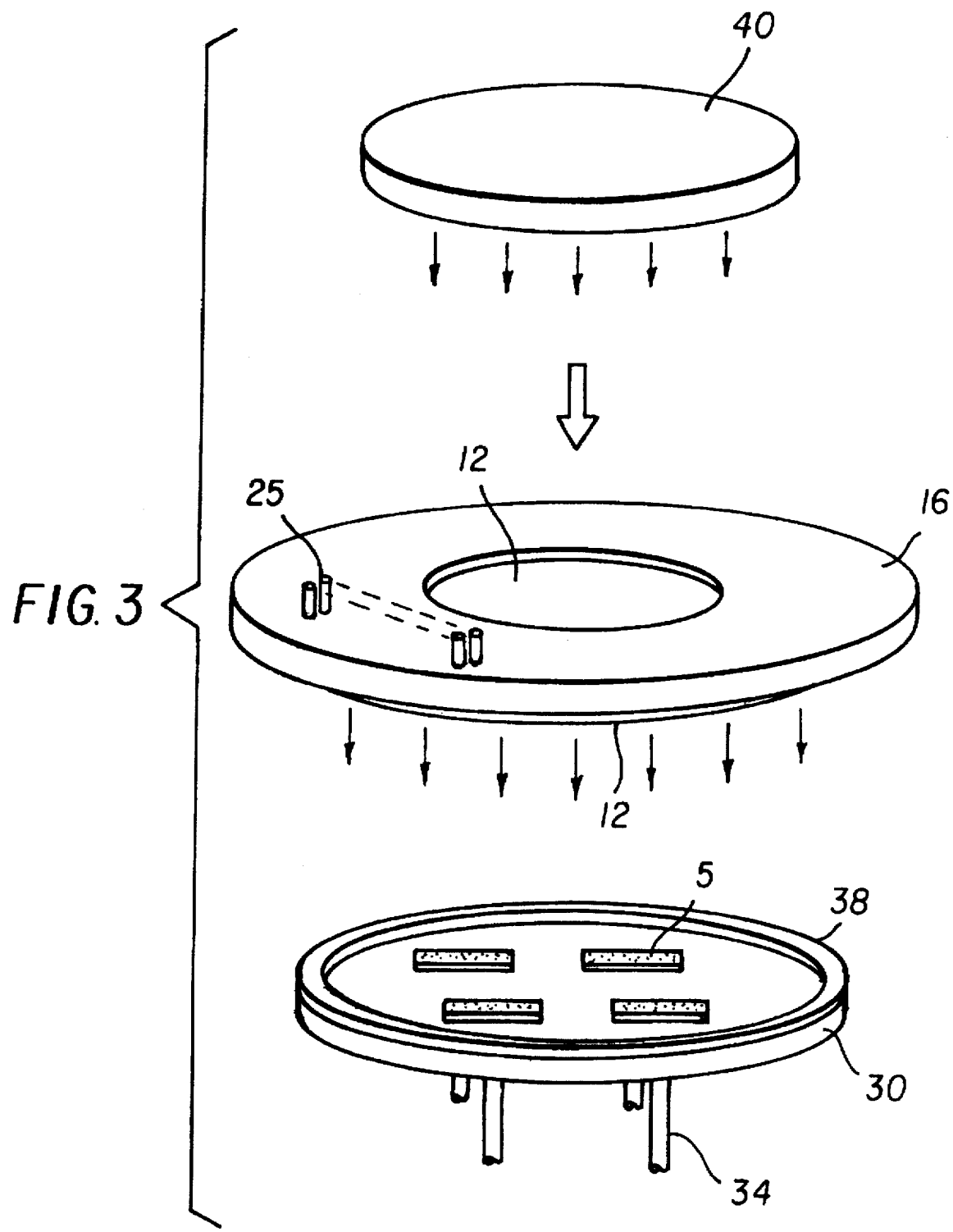

ASSEMBLY TECHNIQUE FOR AN IMAGE SENSOR ARRAY

BACKGROUND OF THE INVENTION

1. Field of Invention

The present invention pertains to image sensor arrays and more particularly to an assembly technique for image sensor arrays.

2. Description Relative to the Prior Art

Numerous prior art devices and techniques have disclosed methods and apparatus for fashioning multiple semiconductor devices and image sensing devices into arrays. To place an array of CCD devices on a substrate, it is critical to maintain the surface of devices in the same focal plane. Conventional techniques have employed optical methods using micro manipulators to ensure the tight tolerances required to bond devices on a common substrate. These techniques are labor intensive and time consuming and, therefore, are not preferred in a manufacturing environment.

Among these prior art devices is U.S. Pat. No. 4,528,747 issued to Hoffman, et al (hereinafter referred to as Hoffman) which disclosed techniques for mounting multi-lead components on a circuit board. The teachings of Hoffman disclosed how to use pre-cut templates for defining an area of the components as an assembly technique, however, the disclosure of Hoffman was limited to the usage of releasable templates and employing cutouts within the templates. The placing of semiconductor devices did not address problems associated with keeping image sensing devices within a single focal plane during the assembly period.

Another prior art device was disclosed by Hammer et al in U.S. Pat. No. 3,859,723 (hereinafter referred to as Hammer) which discussed photoresist etching to create templates. While Hammer did discuss using adhesives and apertures within templates to create assemblies using metalization pattern, it again did not discuss the problems associated with placing the image sensing devices remain within a single focal plane.

As can be seen by the above discussion, there remains a need within the prior art for a method and apparatus which allows placement of multiple CCD devices on a common substrate within the same focal plane, that is economically realistic in terms of manufacturing considerations. It is these considerations and others that are addressed by the present invention.

SUMMARY OF THE INVENTION

The present invention discloses a new package design and a method of mechanically assembling an array of CCD image devices on a substrate to address the aforementioned problems within the prior art. By providing a substrate having interface means for transmitting signals by which electrical signals from the CCD sensors to be employed and, placing thereon, a template that is created having at least one cutout for relative positioning of the CCD devices in a manner compatible with the interface means upon the substrate, the CCD sensors are kept within a single focal plane, by providing a base having a predetermined degree of flatness to allow the sensors to exist within a single focal plane. Apertures exist within the base at points coinciding with the cutouts within the template. By attaching vacuum means to the aperture(s) for securing the sensors to the base, and placing the CCD sensors within the cutouts in the template and turning the vacuum means on to secure placement of the sensors, the template can be removed and an adhesive is applied to a side of the sensors opposite the apertures, and their active image sensing areas. By engaging the substrate with the base in a predetermined manner the image active sensing remain within the same focal area controlled by the flatness of the base having a the lack of flatness within the substrate compensated for by the thickness in the adhesive.

It is an object of the present invention to teach a method of assembling image sensing devices whereby an array of image sensing devices are kept in a single focal plane.

Another object of the invention is to disclose a method of assembling image sensing devices such that they are kept in a single focal plane using simple techniques and inexpensive materials.

It is still further an object of the invention to disclose a method of placing image sensing devices within an assembly whereby epoxy can be used in lieu of finishing techniques to create a flat surface and leave the image sensing devices in a single focal plane.

It is still further an object of the invention to disclose a device that can be used with the accompanying method as disclosed herein to create an assembly whereby image sensing devices are kept in a single focal plane using very inexpensive materials.

The above and other objects of the present invention will become more apparent when taken in conjunction with the following description and drawings wherein like characters indicate like parts and which drawings form a part of the present invention.

The assembly process has the advantageous effect that it can be used to bond an array of image sensors on a substrate with any degree of flatness and still maintain the surface of the dyes containing the image active area within a single focal plane. Assembling electronic packages with an optically flat surface, flat to a tolerance of approximately between 2 and 3 microns can be accomplished relatively simply, in manufacturing terms.

BRIEF DESCRIPTION OF THE DRAWINGS

FIG. 3 is a diagram of assembly being create by placing a substrate over the mounting base carrying sensors.

FIG. 4b shows a side view of FIG. 4a.

FIG. 4c is a bottom view of the structure shown in FIG. 4a.

DETAILED DESCRIPTION OF THE INVENTION

Figure 1:
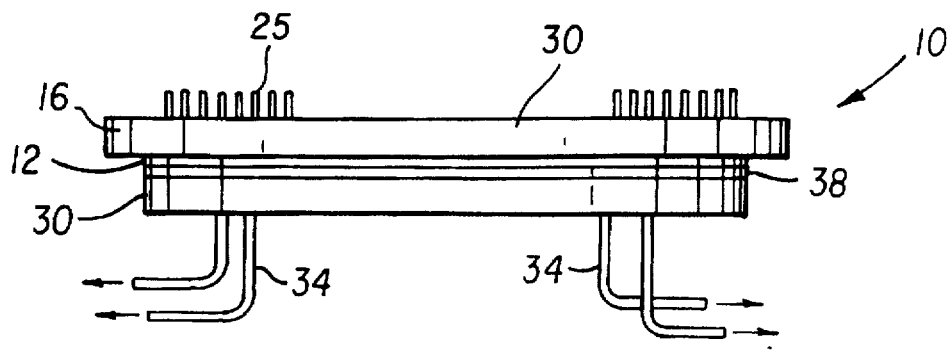
FIG. 1 is a diagram of an assembled version of the preferred embodiment of the present invention.

Referring to FIG. 1, assembly 10 of the present invention is illustrated wherein substrate 12 and ceramic base 16 are assembled with mounting base 30 having enclosed sensors 5 (not shown) to form assembly 10. Vacuum lines 34 can be seen leading from the bottom mounting base 30 of assembly 10.

Figure 2A:
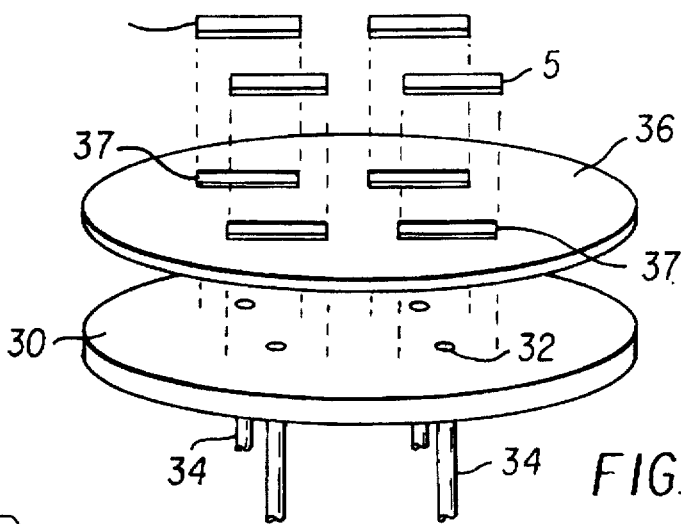
FIG. 2a shows the placement of vacuum lines and templates to achieve proper placement of CCD sensors.
Figure 2B:
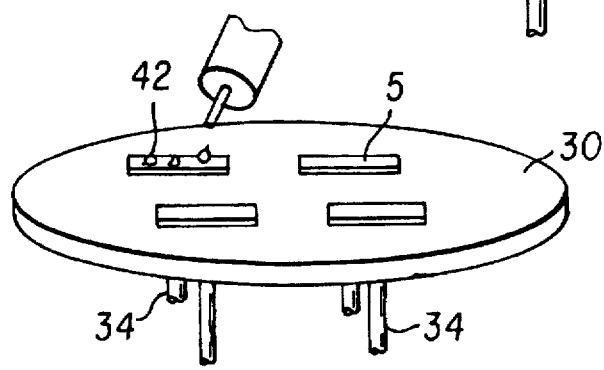
FIG. 2b shows the application of adhesive once the CCD sensors are being held in place by the vacuum lines.
Figure 2C:
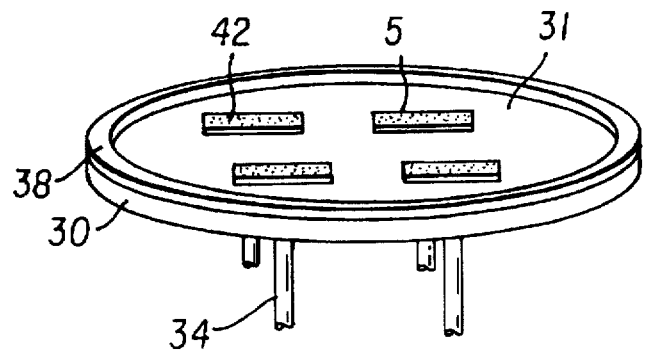
FIG. 2c shows the spacer of the spacer to the mounting base.

FIG. 2a through FIG. 2c illustrate the construction of mounting base 30 that is used to mount sensors 5 within assembly 10 to create the new electronic package as shown in FIG. 1.

Referring now to FIG. 2a which illustrates the process whereby CCD sensors 5 are attached to mounting base 30, which is a very flat surface. Vacuum lines 34 are attached to the lower openings of through holes 32 within the mounting base 30. A template 36, having cutouts 37, a spacer 38 and weight 40 (FIG. 2c) are required for the assembly process. The openings of cutouts 37 within template 36 are used to properly place the sensors 5 in a predetermined desired position. The opening of the cutout is slightly larger than the CCD image sensor 5 so that the sensor can be dropped into the cutout 37 easily.

The steps in the assembly process require that the template 36 be placed over the mounting base 30 according to the alignment marks 34 on the top surface 31 of the mounting base 30. Then a selected set of CCD sensors that have, preferably, been tested to ensure that they function electrically are placed upside down into cutouts 37 within template 36. Placing sensors 5 upside down into cutouts 37 allows the photosensitive portion of sensors 5 to be immediately adjacent to the mounting base 30. Vacuum lines 34 are then placed in position through the through holes beneath the mounting base 30 in order to secure the CCD sensors 5 within the cutouts 37 of template 36. A vacuum (not shown) is then turned on and the vacuum lines 34 secure the CCD sensors 5 within the cutouts 37.

Referring now to FIG. 2b, an illustration of the substrate with CCD devices 5 in their desired placement, it can be seen that removal of template 36 is possible due to the fact that the sensors 5 are secured by a suction created by the vacuum within the vacuum lines 34. As should be clearly apparent, the template needs to be removed slowly to realize the proper positioning of sensors 5, as shown in FIG. 2b, without inadvertently moving any of CCD sensors 5. The back of the sensors 5 are coated with an adhesive 42 while the fronts of the sensors are securely held in place by vacuum lines 34. In the preferred embodiment Zymet ZVR-6000 is employed as the adhesive. However, numerous types of adhesives are equally usable.

Referring to FIG. 2c, once the template is removed spacer 38 can be laid down on to the mounting base 30. The spacer 38 is used to provide proper spacing of base 30 within the package assembly 10. Spacer 38 within the preferred embodiment is 0.023 inches thick. Spacer 38 will determine the thickness of adhesive 42 that is applied to create the assembly package 10. Although, the thickness of the spacer 38 and adhesive 42 will be variable according to the specific desires of the invention and this will be described in further detail below.

Referring now to FIG. 3, which is an illustration of the assembly of the package previously discussed with sensors 5 being attached to the mounting base 30 being placed upon another package comprising sapphire substrate 12 and base ceramic 16 to create the package assembly 10 as shown in FIG. 1. The package containing the sapphire substrate 12 and the ceramic substrate 16 may be lowered upside down such that the spacer 38 engages upon mounting base 30. The process can be monitored through the back of the sapphire substrate 12. The transparent nature of the sapphire is very useful for process of monitoring the activity of attaching mounting base 30 with spacer 38 and sensors 5 to the sapphire substrate 12 and ceramic base package 16. Necessary adjustments can be made according to alignment marks 50 seen through the transparent sapphire of substrate 12. These alignment marks are contained on the mounting base 30. Weight 40 is then placed on the back of the assembly 10 to provide sufficient force to the assembly keep the various pieces together before a curing cycle takes place. Typically either sapphire or quartz are used to create the substrate 12 within the preferred embodiment.

Figure 4A:
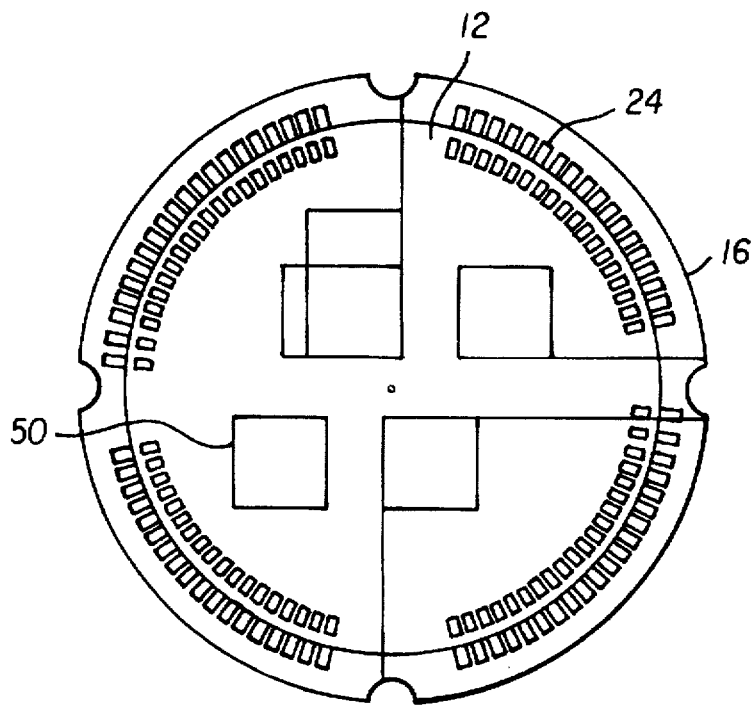
FIG. 4a shows a top view of the sapphire substrate on the ceramic substrate illustrating the metalization on ceramic used to braze the sapphire substrate onto the ceramic.

Referring to FIG. 4a, which is a top view of the sapphire substrate 12 mounted on the ceramic substrate 16, illustrating metalized pads 24 on the top surface 31 of the ceramic base 16 which allow it to be brazed to the sapphire substrate 12 by being soldered to the sapphire or quartz substrate 12. A thin film metalized pattern 14 (not shown) exists on substrate 12 and these thin metalized patterns 14 are used to make interconnects with the CCD image sensors 5 that are contained within the assembly. There are metalized pads 24 on the top surface 31 of the ceramic base. The sapphire substrate 12 or quartz if that is which is used, is soldered to the metalized pads 24 on the top surface 31 of the ceramic base 16. The metalization of the ceramic base allows the sapphire substrate 12 to be brazed onto the ceramic base 16. The interconnects are made from the CCD image sensors through wire bonding 6 to the metalized lines 15 on the sapphire substrate 12 to the metalized pads 24 on the ceramic base 16.

Figure 4B:
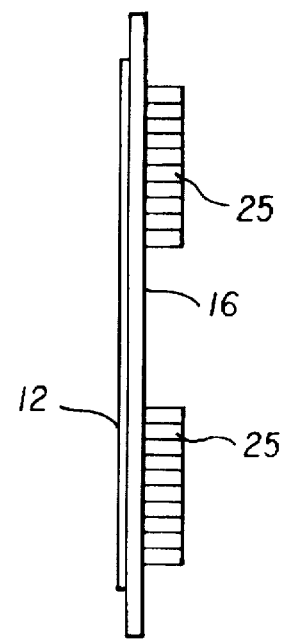
Figure 4C:
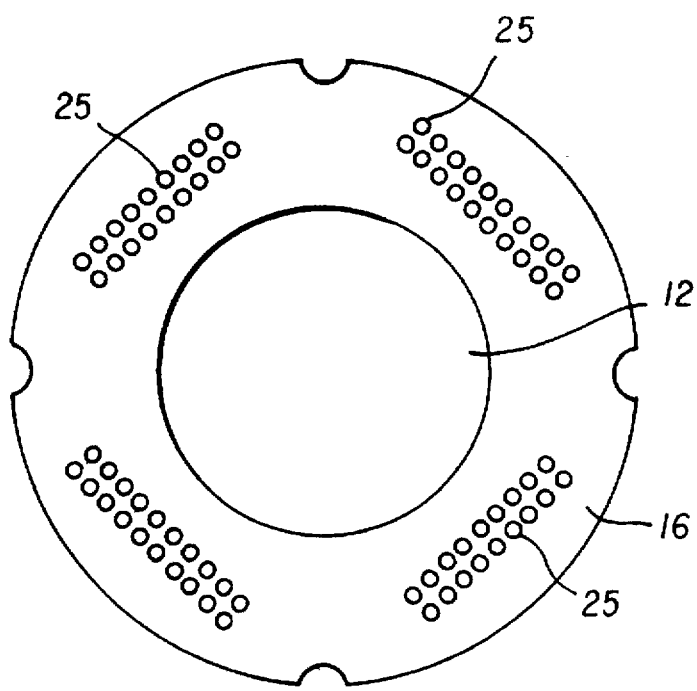

Referring to FIGS. 4a and 4b, several sets of metal pads 24 on the ceramic base can be seen, these pads 24 are used to form the interconnects from the CCD image sensors 5 and electrically follow through to the pins 25 on the ceramic base. The pins are contained on the back of the ceramic base 16.

The method and apparatus taught by the present invention disclose a technique whereby the flatness of the substrate 12 can be crowned to any degree of finishing before the thin film coating is deposited. The process whereby the assembly 10 as shown in FIG. 1 is completed is illustrated in the accompanying figures. Various fixtures are required for this process. These fixtures are shown in FIGS. 2a through 2c and include a mounting base 30 that has a finely finished top surface 31 in and a set of through holes 32 at locations where it is intended that the CCD image senses are bonded.

The present invention has the advantages of allowing the assembly of an array of CCD image sensors while maintaining surface of all the sensors on a single optical plane. This is accomplished by a spacer 38 and adhesive 42. Spacer 38 is selected in the preferred embodiment to be 23 mils thick, that's 0.023 inches. However, there may be numerous embodiments used to assemble arrays of image sensing devices whereby many different thicknesses of spacers could be used. The thickness of the spacer is important taken in conjunction with the amount of adhesive 42 that's going to be used. It is important to note that with the process of the present invention that only one of the surfaces to which the image sensing devices are attached to need to be flat. This would be the mounting base 30 through which through holes 32 pass. It is important that mounting base 30 be flat and very consistent having a tolerance that will ensure that the image sensors 5 placed on mounting base 30 are within the same focal plane. This focal plane is determined by mounting base 30. However, it is not necessary that substrate 12 and base 16 have a perfectly flat surface due to the placement of adhesive 42 upon the image sensors 5. Here, the image sensors 5 will have adhesive 42, which in the preferred embodiment may be either epoxy, silicone or polyimide, applied to a depth that will allow the adhesive, used in conjunction with mounting base 30 to create a structure of the sensors upon sapphire substrate 12, wherein, the sensors 5 reside on the substrate 12 in an identical focal plane. This is accomplished without the requirement of having to finely finish the sapphire substrate to the tolerance required to keep the sensors 5 within the same focal plane. Typically, the adhesive applied is anywhere between 2 to 7 mils, to operate with the size of the spacer 38. Used in conjunction with spacer 38, the epoxy takes up any lack of flatness that exists within the substrate 12 thereby leaving the CCDs perfectly flat in the same focal plane due to the reliance on the flatness of base 30 to keep the sensors 5 within the same focal plane. Upon assembly of base 30 and substrate 12 the vacuum lines 34 may be removed. By initially setting up the image sensors 5 to be in the same focal plane they will remain in the same focal plane once the epoxy dries and when the entire package is cured.

While there has been shown what is considered to be the preferred embodiment of the invention, it will be manifest that many changes and modifications may be made therein without departing from the essential spirit of the invention. It is intended, therefore, in the annexed claims, to cover all such changes and modifications as may fall within the true scope of the invention.

PARTS LIST

5. CCD sensors
6. Wire bonding
10. Assembly
12. Substrate
14. Metalized pattern
15. Metalized lines
16. Base ceramic
18. Metal pins
20. Front of ceramic surface
22. Back of Ceramic
24. Metalized pads
25. pins
30. Mounting base
31. Top surface
32. Through Holes
33. Alignment marks
34. Vacuum lines
36. template
37. Cutouts
38. Spacer
40. Weight
42. Adhesive
50. Alignment mark

What is claimed is:

1. An improved method of placing an array of CCD image sensors on a substrate to maintain a single focal plane among the CCD image sensors comprising the steps of:
    providing a substrate having interface means for transmitting signals from at least one of the CCD image sensors;
    creating a template having at least one cutout for relative positioning of the CCD image sensors in a compatible manner upon the substrate such that the CCD image sensors are within a single plane;
    providing a base having a predetermined degree of flatness to allow the sensors to exist within a single focal plane, and having at least one aperture within the base at points coinciding with the cutouts within the template;
    attaching vacuum means to the aperture(s) for securing the CCD image sensors to the base;
    placing the CCD image sensors within the cutouts in the template and turning the vacuum means on to secure placement of the sensors;
    removing the template;
    applying an adhesive to a side of the CCD image sensors opposite the aperture(s), the adhesive having a predetermined thickness that is determined by tolerances of the substrate flatness, the predetermined thickness being used to compensate for lack of flatness within the substrate; and
    engaging the substrate with the base in a predetermined manner.

2. The method of claim 1 where the step of engaging further comprises engaging according to alignment marks contained on at least one of the base or the substrate.

3. The method of claim 1 further comprising the step of selecting a predetermined set of CCD image sensors that are compatible with the cutouts in the template.

4. The method of claim 1 wherein the step of providing a substrate further comprises providing a substrate having a transparent portion such that the assembly process can be monitored, therethrough.

5. The method of claim 1 wherein prior the step of engaging a step of laying a spacer that has a predetermined thickness upon the base is accomplished.

6. The method of claim 1 further comprising the step of applying a force to the assembly to help secure the adhesive.

7. The method of claim 1 further comprising the step of curing the assembly for a predetermined period of time.

8. The method of claim 1 wherein a spacer is placed upon the base, the spacer having a thickness that is determined by flatness tolerances of the substrate and the predetermined thickness of the adhesive employed.

* * * * *